(12) United States Patent
Ohta

(10) Patent No.: US 10,991,906 B2
(45) Date of Patent: Apr. 27, 2021

(54) DISPLAY DEVICE, METHOD FOR MANUFACTURING DISPLAY DEVICE, AND MANUFACTURING APPARATUS OF DISPLAY DEVICE

(71) Applicant: Sharp Kabushiki Kaisha, Sakai (JP)

(72) Inventor: Yoshifumi Ohta, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/623,461

(22) PCT Filed: Jun. 21, 2017

(86) PCT No.: PCT/JP2017/022901
§ 371 (c)(1),
(2) Date: Dec. 17, 2019

(87) PCT Pub. No.: WO2018/235206
PCT Pub. Date: Dec. 27, 2018

(65) Prior Publication Data
US 2020/0185644 A1 Jun. 11, 2020

(51) Int. Cl.
*H01L 51/52* (2006.01)
*H01L 27/32* (2006.01)
*H01L 51/56* (2006.01)

(52) U.S. Cl.
CPC ...... *H01L 51/5246* (2013.01); *H01L 27/3258* (2013.01); *H01L 51/5256* (2013.01); *H01L 51/56* (2013.01); *H01L 2251/301* (2013.01)

(58) Field of Classification Search
CPC . H01L 51/5246; H01L 51/5256; H01L 51/56; H01L 27/3258; H01L 2251/301
USPC .......................................................... 257/40
See application file for complete search history.

(56) References Cited

U.S. PATENT DOCUMENTS

| | | | |
|---|---|---|---|
| 10,193,102 B2 * | 1/2019 | Kanaya | ............. H01L 29/78669 |
| 2003/0034497 A1 | 2/2003 | Yamazaki et al. | |
| 2004/0004214 A1 | 1/2004 | Yamazaki et al. | |
| 2015/0280172 A1 | 10/2015 | Nishinohara et al. | |
| 2017/0125733 A1 | 5/2017 | Kwon et al. | |
| 2017/0280531 A1 | 9/2017 | Tada et al. | |

(Continued)

FOREIGN PATENT DOCUMENTS

| | | |
|---|---|---|
| JP | 2003-100450 A | 4/2003 |
| JP | 2004-047447 A | 2/2004 |
| JP | 2007-080569 A | 3/2007 |

(Continued)

OTHER PUBLICATIONS

Official Communication issued in International Patent Application No. PCT/JP2017/022901, dated Sep. 5, 2017.

*Primary Examiner* — Tu-Tu V Ho
(74) *Attorney, Agent, or Firm* — Keating & Bennett, LLP

(57) ABSTRACT

A display device includes a light-emitting element layer including a light-emitting element, a TFT layer formed in a lower layer than the light-emitting element layer and including a transistor configured to be used to drive the light-emitting element, and a sealing layer with which the light-emitting element layer is covered. The sealing layer includes a first inorganic sealing film and a second inorganic sealing film in an upper layer than the first inorganic sealing film, and an end face of the TFT layer is covered with the second inorganic sealing film.

18 Claims, 29 Drawing Sheets

(56) References Cited

U.S. PATENT DOCUMENTS

2018/0151834 A1\* 5/2018 Kanaya .............. H01L 27/3258

FOREIGN PATENT DOCUMENTS

| JP | 2015-195104 A | 11/2015 |
| JP | 2016-072127 A | 5/2016 |
| JP | 2017-084776 A | 5/2017 |

\* cited by examiner

DISPLAY DEVICE, METHOD FOR MANUFACTURING DISPLAY DEVICE, AND MANUFACTURING APPARATUS OF DISPLAY DEVICE

TECHNICAL FIELD

The disclosure relates to a display device.

BACKGROUND ART

Light-emitting elements such as organic EL elements have low resistance to foreign matter such as water or oxygen. PTL 1 discloses a sealing configuration for organic EL elements in a display device.

CITATION LIST

Patent Literature

PTL 1: JP 2016-72127 A (published on May 9, 2016)

SUMMARY

Technical Problem

Known sealing configurations have a small effect, and this causes a problem in that the light-emitting element deteriorates due to the impregnated foreign matter.

Solution to Problem

A display device includes a light-emitting element layer including a light-emitting element, a TFT layer formed in a lower layer than the light-emitting element layer and including a transistor configured to be used to drive the light-emitting element, and a sealing layer with which the light-emitting element layer is covered. The sealing layer includes a first inorganic sealing film and a second inorganic sealing film in an upper layer than the first inorganic sealing film, and at least a part of an end face of the TFT layer is covered with the second inorganic sealing film.

Advantageous Effects of Disclosure

The sealing layer has a great sealing effect, and the light emitting-element layer is less likely to deteriorate.

DESCRIPTION OF EMBODIMENTS

First Embodiment

Figure 1:
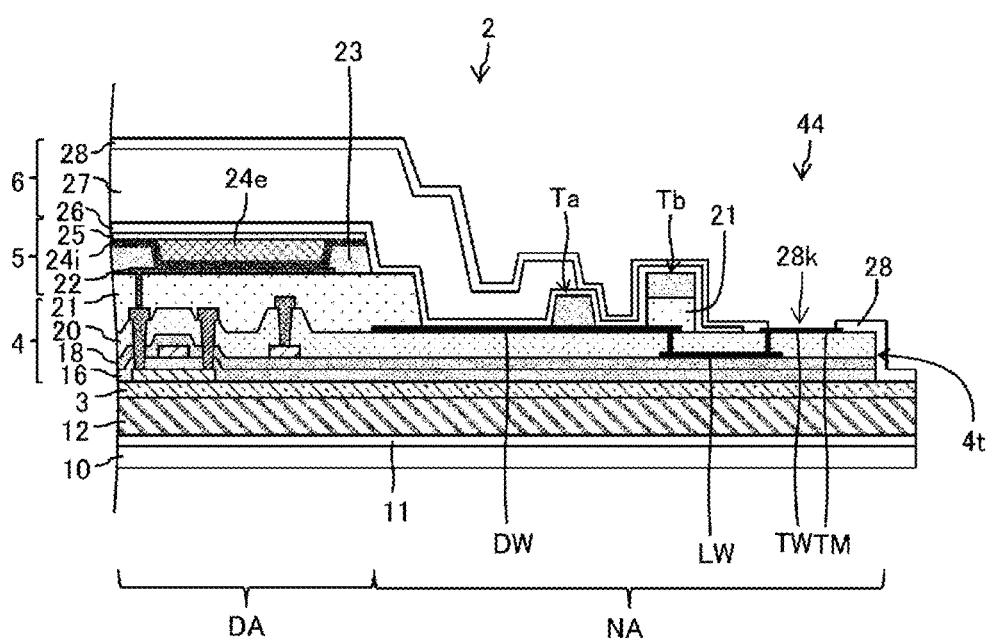
FIG. 1 is a cross-sectional view illustrating a periphery of a terminal portion of a display device according to a first embodiment of the disclosure.
Figure 2A:
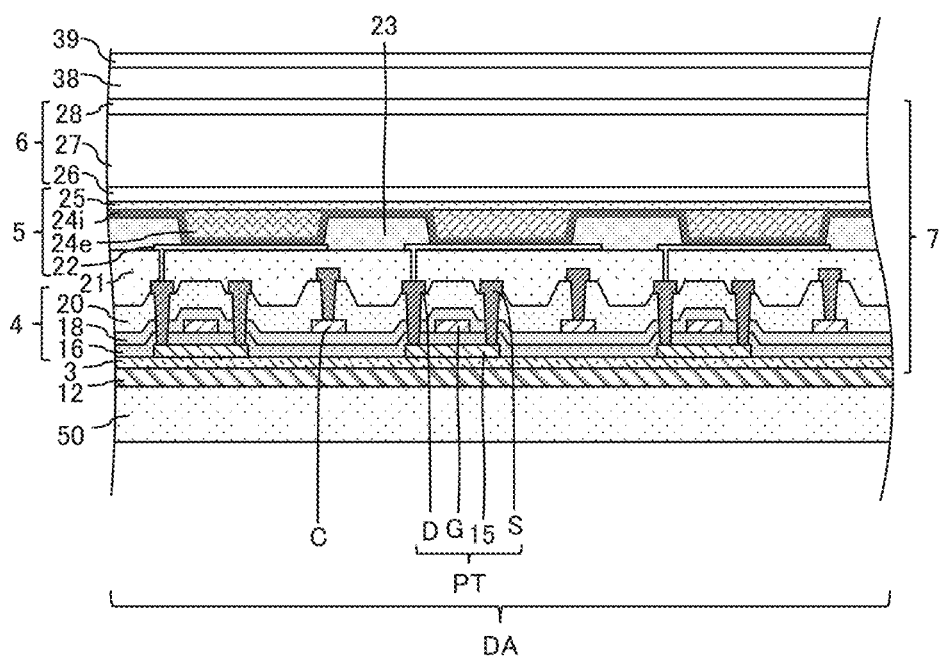
FIG. 2A is a cross-sectional view illustrating a periphery of a pixel area of a display device according to the first embodiment of the disclosure.
Figure 2B:
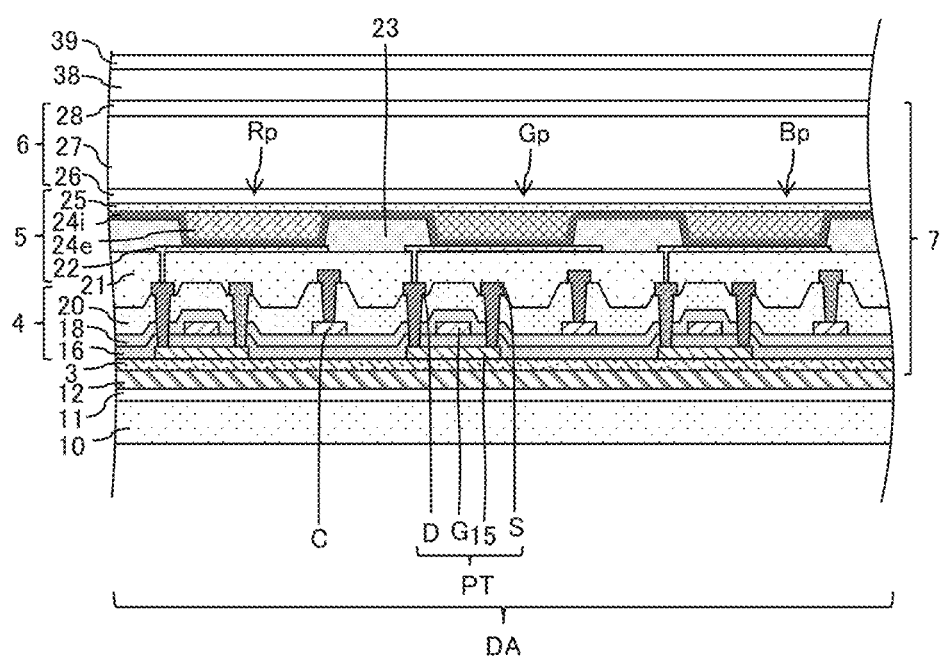
FIG. 2B is a cross-sectional view illustrating a periphery of a pixel area of a display device according to the first embodiment of the disclosure.

FIG. 1, FIG. 2A, and FIG. 2B are cross-sectional views illustrating a display device 2 according to the first embodiment. FIG. 1 is a cross-sectional view of a periphery of a terminal portion 44, and FIG. 2A and FIG. 2B are a cross-sectional view of a periphery of a pixel area including a light-emitting element layer 5.

Figure 3:
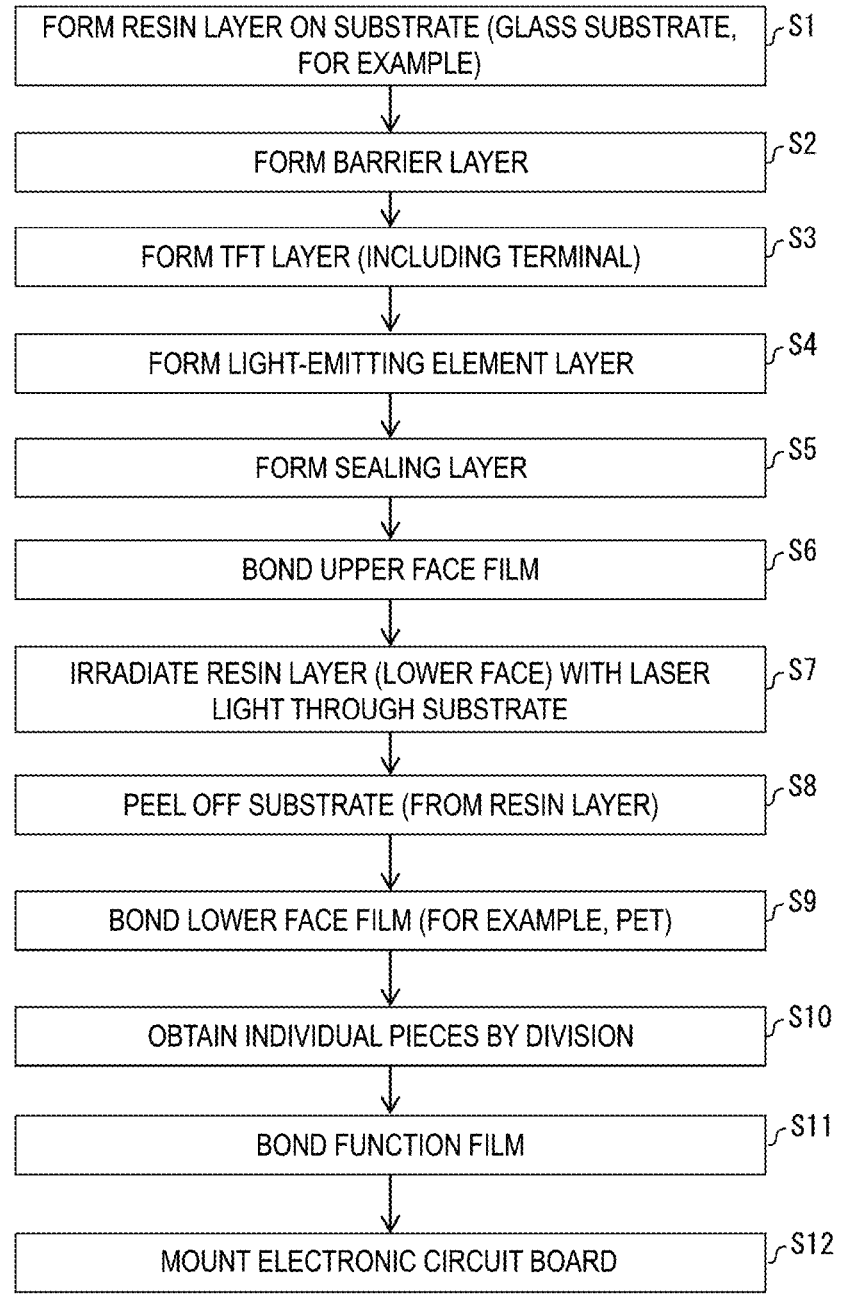
FIG. 3 is a flowchart illustrating a manufacturing process of a display device according to the first embodiment of the disclosure.

A method for manufacturing a display device according to the present embodiment will now be described with reference to FIG. 1, FIG. 2A, and FIG. 2B, following a flowchart illustrated in FIG. 3.

As illustrated in FIG. 2B, first, a resin layer 12 is formed above a base material 10 (step S1). Next, a barrier layer 3 is formed (step S2). Next, a TFT layer 4 including a gate insulating film 16, passivation films 18 and 20, and an organic interlayer film 21 is formed (step S3). Next, a light-emitting element layer (e.g., an OLED element layer) 5 is formed (step S4). Next, a sealing layer 6 including an inorganic sealing film 26, an organic sealing film 27, and an inorganic sealing film 28 is formed to obtain a layered body 7 (step S5). Next, the layered body 7 is divided and singulated together with the base material 10 (step S10). Next, a function film 39 is bonded with an adhesive layer 38 between the function film 39 and the layered body 7 (step S11). Next, an electronic circuit board is mounted on an end portion of the TFT layer 4 (step S12). In this way, the display device 2 illustrated in FIG. 2A and FIG. 2B are obtained. Note that each of the steps is performed by a manufacturing apparatus of a display device.

Note that, in a case that a flexible display device is manufactured, as illustrated in FIG. 2A, first, the layered body 7 (the resin layer 12, the barrier layer 3, the TFT layer 4, the light-emitting element layer 5, and the sealing layer 6) is formed on a glass substrate 50, for example. Next, an upper face film is bonded (step S6), and a lower face of the resin layer 12 is irradiated with laser light through the glass substrate 50 (step S7). Here, the lower face (the interface with the glass substrate 50) of the resin layer 12 is altered by ablation, and the bonding force between the resin layer 12 and the glass substrate 50 is reduced. Next, the glass substrate 50 is peeled off from the resin layer 12 (step S8). Next, the base material 10 (for example, a lower face film made of polyethylene terephthalate (PET) or the like) is bonded to the lower face of the resin layer 12 with an adhesive layer 11 therebetween (step S9). Subsequently, the process proceeds to step S10 described above.

Examples of the material of the resin layer 12 include polyimide, epoxy, and polyamide. Examples of the material of the lower face film 10 include polyethylene terephthalate (PET).

The barrier layer 3 is a layer for preventing foreign matter such as moisture or impurities from reaching the TFT layer 4 or the light-emitting element layer 5 during usage of the display device. The barrier layer 3 may be configured by a silicon oxide film, a silicon nitride film, or a silicon oxynitride film, or a layered film thereof, formed using CVD, for example.

The TFT layer 4 includes a semiconductor film 15, a gate insulating film 16 formed in an upper layer than the semiconductor film 15, a gate electrode G formed in an upper layer than the gate insulating film 16, the passivation films 18 and 20 formed in an upper layer than the gate electrode G, a capacitance electrode C and a terminal TM formed in an upper layer than the passivation film 18, a source electrode S and a drain electrode D formed in an upper layer than the passivation film 20, and an organic interlayer film (flattening film) 21 formed in an upper layer than the source electrode S and the drain electrode D. A thin film transistor (TFT) is configured with including the semiconductor film 15, the gate insulating film 16, and the gate electrode G. In a non-active area, a plurality of terminals TM configured to be used for connection with an electronic circuit board are formed in a metal layer of the TFT layer 4.

The semiconductor film 15 is made of low-temperature polysilicon (LTPS) or an oxide semiconductor, for example. The gate insulating film 16 may be configured by a silicon oxide (SiOx) film or a silicon nitride (SiNx) film, or a layered film thereof, formed using CVD, for example. The gate electrode G, the source electrode S, the drain electrode D, and the terminal are configured by a single layer film or a layered film of a metal including at least one of aluminum (Al), tungsten (W), molybdenum (Mo), tantalum (Ta), chromium (Cr), titanium (Ti), or copper (Cu), for example. Note that, the TFT provided with the semiconductor film 15 for forming the channel is illustrated as a top gate structure in FIG. 2A and FIG. 2B; however, the TFT may have a bottom gate structure (in a case that the channel of the TFT is formed in an oxide semiconductor, for example).

The gate insulating film 16 and the passivation films 18 and 20 may be configured by a silicon oxide (SiOx) film or a silicon nitride (SiNx) film, or a layered film thereof, formed using CVD, for example. The organic interlayer film 21 may be formed of a coatable photosensitive organic material, such as polyimide or acrylic, for example.

The light-emitting element layer 5 (e.g., an organic light-emitting diode layer) includes a first electrode 22 (e.g., anode electrode) formed in an upper layer than the organic interlayer film 21, an organic insulating film 23 with which an edge of the first electrode 22 is covered, an electroluminescence (EL) layer 24e formed in an upper layer than the first electrode 22, and a second electrode 25 formed in an upper layer than the EL layer 24e. A light-emitting element (e.g., an organic light-emitting diode) is configured by the first electrode 22, the EL layer 24e, and the second electrode 25. The organic insulating film 23 in an active area DA functions as a bank (pixel partition) that defines a subpixel.

The organic insulating film 23 may be made of a coatable photosensitive organic material such as polyimide or acrylic, for example. The organic insulating film 23 may be formed by applying the above-described material to the active area DA and the non-active area NA by a slit coating method, for example.

In the non-active area NA, bank-shaped protruding portions Ta and Tb surrounding the active area are provided. The protruding portion Ta defines an edge of the organic sealing film 27 (e.g., a film formed by an ink-jet method). The protruding portion Tb is provided on the peripheral side from the protruding portion Ta on the substrate. Thus, even in a case that the organic sealing film 27 applied by the ink-jet method flows over the protruding portion Ta, the organic sealing film 27 is held back by the protruding portion Tb. The protruding portions Ta and Tb are configured including at least one of the organic interlayer film 21 or the organic insulating film 23, for example.

The EL layer 24e is formed in a region surrounded by a partition (subpixel region) using a vapor deposition or an ink-jet method. In a case that the light-emitting element layer 5 is an organic light-emitting diode (OLED) layer, the EL layer 24e is configured by layering a hole injecting layer, a hole transport layer, a light-emitting layer, an electron transport layer, and an electron injecting layer successively from the lower layer side, for example. Note that one or more layers of the EL layer 24e may be common layers (shared by a plurality of pixels) such as an EL common layer 24i.

The first electrode (an anode electrode) 22 is configured by layering Indium Tin Oxide (ITO) and an alloy including silver (Ag) and has light reflectivity. The second electrode (e.g., a cathode electrode) 25 is a common electrode and may be formed of a transparent metal such as Indium Tin Oxide (ITO) or Indium Zinc Oxide (IZO).

In a case that the light-emitting element layer 5 is an OLED layer, holes and electrons are recombined in the EL layer 24e by drive current between the first electrode 22 and the second electrode 25 to generate excitons, and then the excitons fall to a ground state to emit light.

An element configured by the light-emitting element layer 5 is not limited to an OLED element, and the light-emitting element layer 5 may constitute an inorganic light-emitting diode or a quantum dot light-emitting diode.

The light-emitting element layer 5 is covered with the sealing layer 6, and the sealing layer 6 prevents foreign matter, such as water or oxygen, from penetrating into the light-emitting element layer 5. The sealing layer 6 includes the inorganic sealing film 26 with which the entire surface of the active area DA including the organic insulating film 23 and the second electrode 25 is covered, the organic sealing film 27 with which the entire surface of the active area DA is covered, the organic sealing film 27 being formed in an upper layer than the inorganic sealing film 26 and functioning as a buffer film, and the inorganic sealing film 28 with which the inorganic sealing film 26 and the organic sealing film 27 are covered. In particular, end faces of the inorganic sealing film 26 and the organic sealing film 27 are covered with the inorganic sealing film 28. At least a part of an end face 4t of the plurality of inorganic insulating films of the TFT layer 4 is covered with the inorganic sealing film 28, and the inorganic sealing film 28 is in contact with an upper face of an end portion of the barrier layer 3.

The function film 39 has an optical compensation function, a touch sensor function, a protection function, and the like, for example. In a case that a layer having one or more of these functions is layered in an upper layer than the light-emitting element layer 5, the function film 39 may be made thinner or omitted. The electronic circuit board is an integrated circuit (IC) chip or a flexible printed circuit board (FPC) to be mounted on the terminal TM illustrated in FIG. 1, for example.

In FIG. 1, the terminal portion 44 includes a plurality of terminals TM in the non-active area NA. The terminal TM is an external connection terminal configured to be used for external connection and configured to transmit a signal to each transistor in the active area DA. The terminal TM may be formed simultaneously with the formation of the TFT layer 4. The terminal TM is connected to a corresponding TFT of the TFT layer 4 with a terminal wiring line TW, a detour wire line LW, and a lead-out wiring line DW therebetween. The terminal wiring line TW and the lead-out wiring line DW are provided on the upper face of the passivation film 20, but the detour wiring line LW is provided on the lower face of the passivation film 20. The detour wiring line LW is connected to the terminal wiring line TW and the lead-out wiring line DW through holes formed in the passivation film 20 therebetween. This can reduce the possibility that foreign matter from between the terminal TM and another layer enters the inside via the wiring line connected to the terminal.

As illustrated in FIG. 1, the end face of the terminal TM is covered with the inorganic sealing film 28. The inorganic sealing film 28 formed on the upper face of the terminal TM is provided with an opening 28k of the inorganic sealing film 28 at a position overlapping the upper face of the terminal TM such that a part of the upper face of the terminal TM is exposed from the inorganic sealing film 28.

Figure 4:
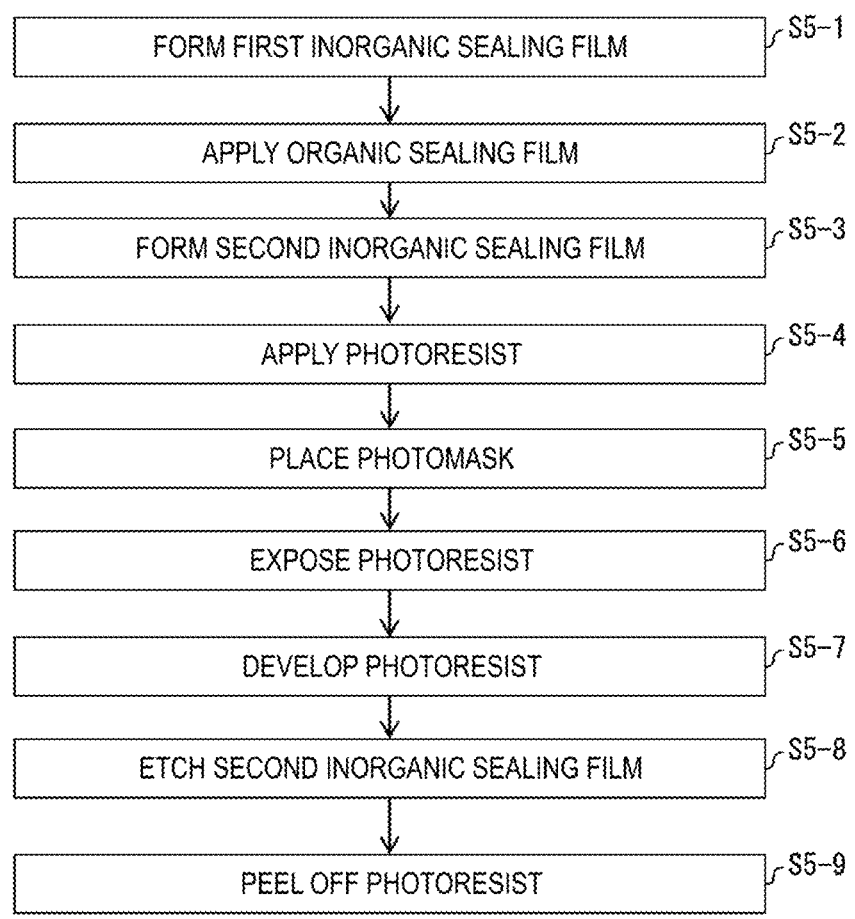
FIG. 4 is a flowchart illustrating a manufacturing process of a sealing layer of a display device according to the first embodiment of the disclosure.

A manufacturing method of a periphery of a terminal portion and a manufacturing method of a sealing layer when manufacturing a display device according to the present embodiment will be described with reference to FIG. 5A to FIG. 10B, following flowcharts illustrated in FIG. 3 and FIG. 4.

Figure 5A:
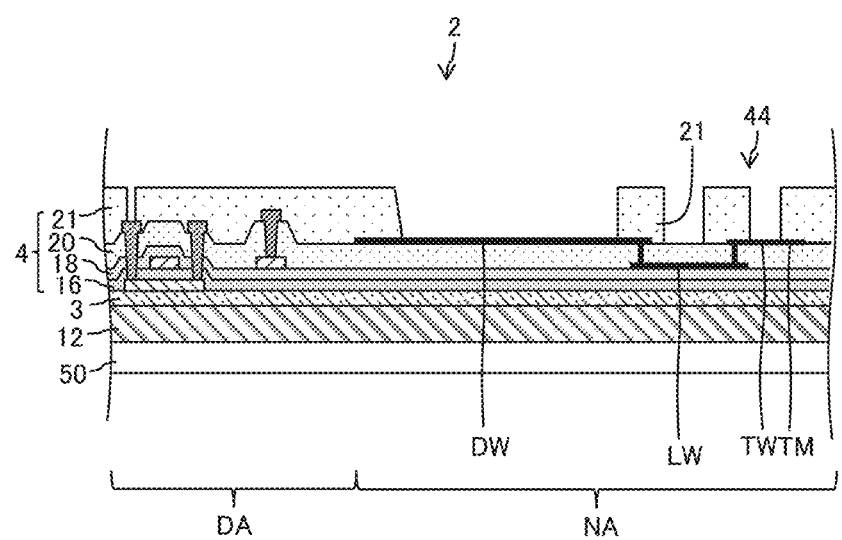
FIG. 5A is a process cross-sectional view sequentially illustrating manufacturing processes of a display device according to the first embodiment of the disclosure.

First, as illustrated in FIG. 5A, steps S1 to S3 are performed, and the resin layer 12, the barrier layer 3, and the TFT layer 4 including the terminal portion 44 are formed on the glass substrate 50. At this time, the organic interlayer film 21 is disposed in a position covering edges of the exposed terminal wiring line TW, the exposed lead-out wiring line DW, and the exposed terminal TM.

Figure 5B:
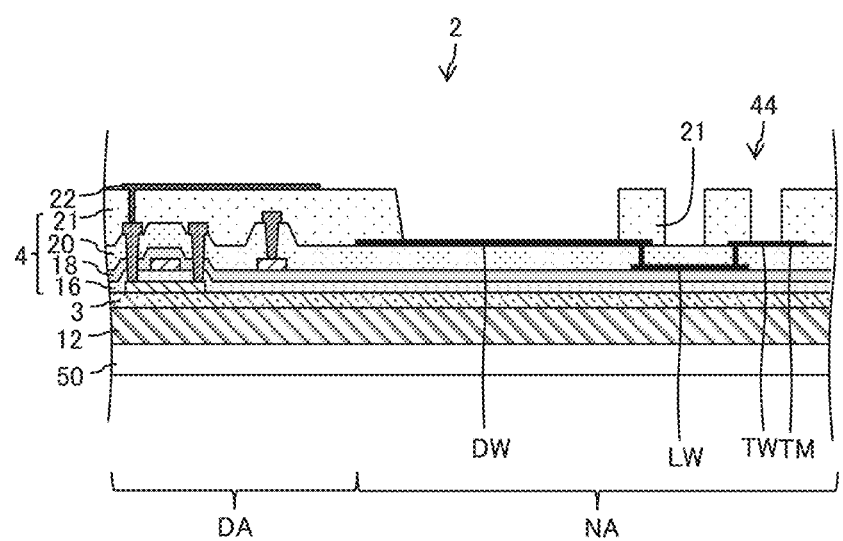
FIG. 5B is a process cross-sectional view sequentially illustrating manufacturing processes of a display device according to the first embodiment of the disclosure.

Next, the light-emitting element layer 5 is formed. First, as illustrated in FIG. 5B, the first electrode 22 connected to the drain electrode of the TFT layer 4 is formed. At this time, since the edges of the terminal wiring line TW, the lead-out wiring line DW, and the terminal TM are covered with the organic interlayer film 21, the terminal wiring line TW, the lead-out wiring line DW, and the terminal TM are not corroded from the end face thereof even in a case that dry etching or the like is used to form the first electrode 22.

Figure 6A:
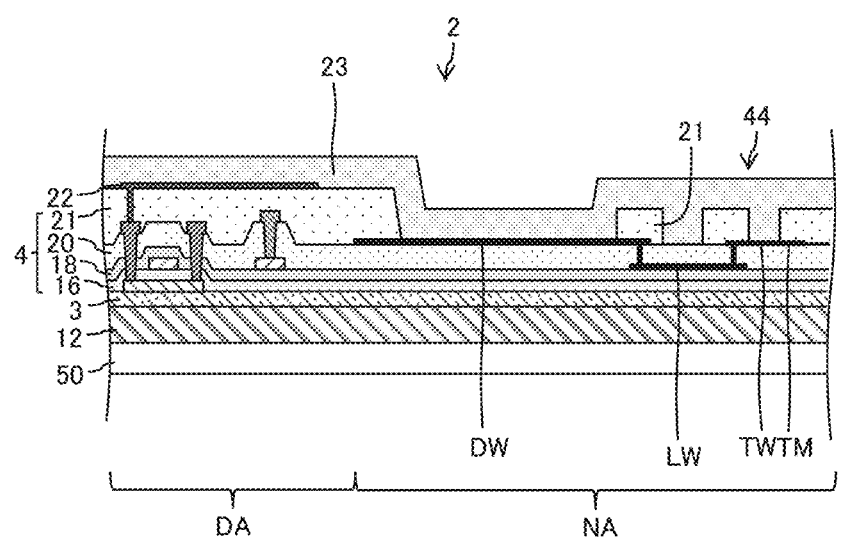
FIG. 6A is another process cross-sectional view sequentially illustrating manufacturing processes of a display device according to the first embodiment of the disclosure.
Figure 6B:
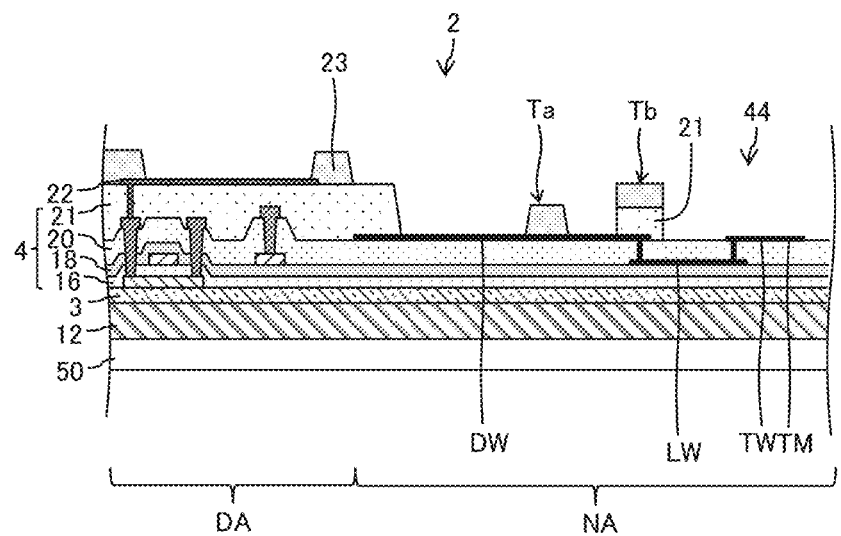
FIG. 6B is another process cross-sectional view sequentially illustrating manufacturing processes of a display device according to the first embodiment of the disclosure.

Next, as illustrated in FIG. 6A, the organic insulating film 23 is applied, and as illustrated in FIG. 6B, the organic insulating film 23 is patterned using photolithography or the like. At this time, the protruding portion Ta is formed by leaving a portion of the organic insulating film 23 on the lead-out wiring line DW. Furthermore, the protruding portion Tb is formed by leaving a portion of the organic insulating film 23 on the organic interlayer film 21 disposed at a position covering the edge of the lead-out wiring line DW. Note that when patterning the organic insulating film 23, the organic interlayer film 21 with which the edges of the terminal wiring line TW and the terminal TM are covered is removed.

Figure 7A:
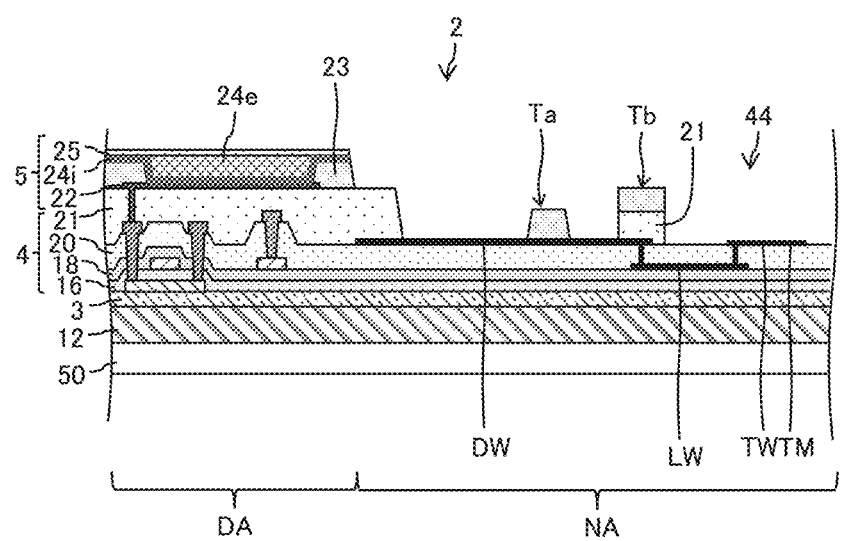
FIG. 7A is another process cross-sectional view sequentially illustrating manufacturing processes of a display device according to the first embodiment of the disclosure.

Next, as illustrated in FIG. 7A, the EL layer 24e and the second electrode 25 are formed to form the light-emitting element layer 5. At this time, the EL layer 24e may be formed by vapor deposition using a mask, and the second electrode 25 may be formed by sputtering using a mask.

Subsequently, the sealing layer 6 is formed. Step S5, which is a step for forming the sealing layer 6, is illustrated in FIG. 4 in detail as a flowchart. First, as illustrated in FIG. 7B, the inorganic sealing film 26 and the organic sealing film 27 are formed (step S5-1 and step S5-2).

The inorganic sealing film 26 may be configured by a silicon oxide film, a silicon nitride film, or a silicon oxynitride film, or a layered film thereof, which are formed by CVD using a mask, for example.

The organic sealing film 27 is a transparent organic insulating film that is thicker than the inorganic sealing film 26 and the inorganic sealing film 28 and may be formed of a coatable photosensitive organic material such as polyimide or acrylic material. For example, after coating the inorganic sealing film 26 with an ink containing such an organic material using the ink-jet method, the ink is cured by ultraviolet (UV) irradiation.

Figure 7B:
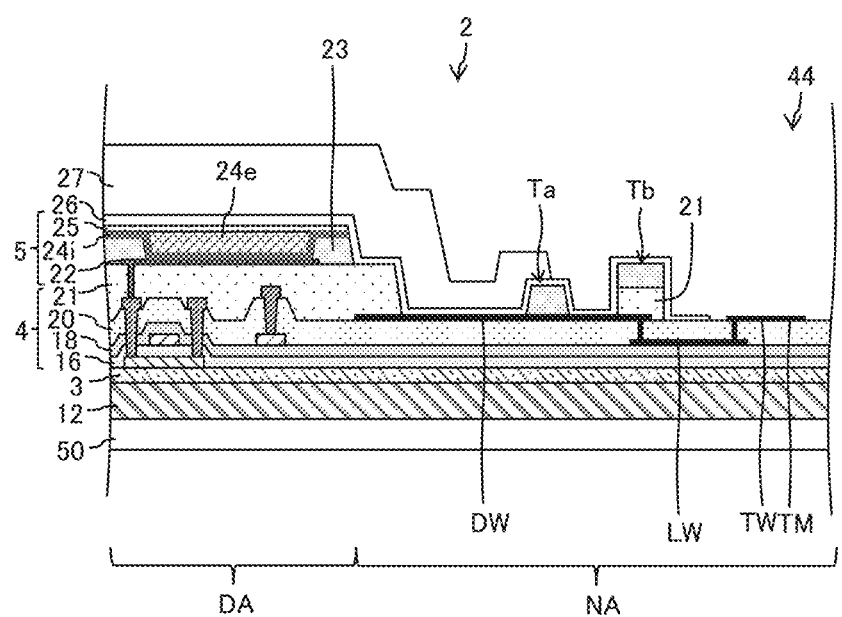
FIG. 7B is another process cross-sectional view sequentially illustrating manufacturing processes of a display device according to the first embodiment of the disclosure.

As illustrated of FIG. 7B, the organic sealing film 27 applied using the ink-jet method is held back by the protruding portion Ta. This can prevent the organic sealing film 27 from being applied as far as the terminal portion 44. Note that even in a case where the protruding portion Ta cannot stop the application of the organic sealing film 27, the protruding portion Tb can stop the application of the organic sealing film 27.

Figure 8A:
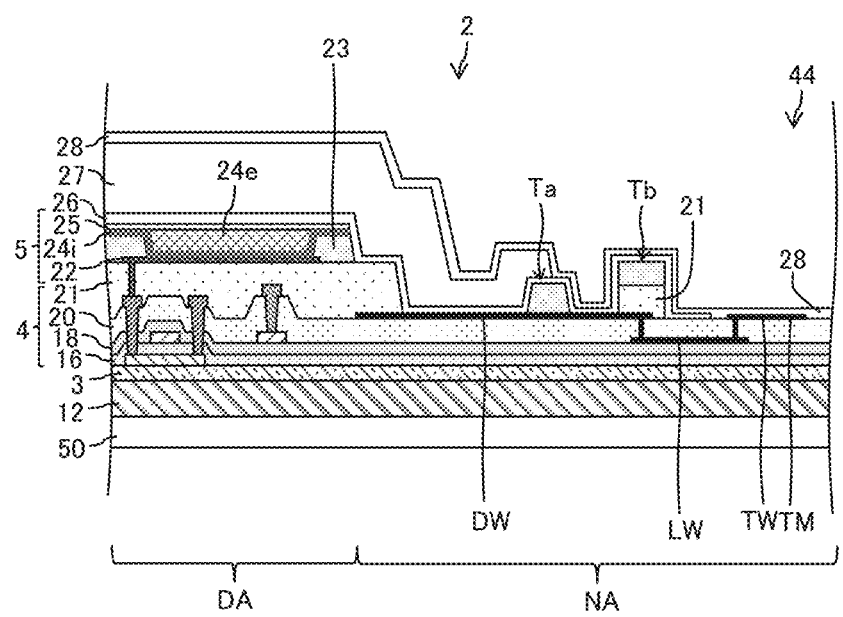
FIG. 8A is another process cross-sectional view sequentially illustrating manufacturing processes of a display device according to the first embodiment of the disclosure.

Next, as illustrated in FIG. 8A, the inorganic sealing film 28 is formed on the organic sealing film 27 (step S5-3). At this time, the inorganic sealing film 28 may be formed using CVD and may also be formed in the frame region including the terminal portion 44, for example.

Figure 8B:
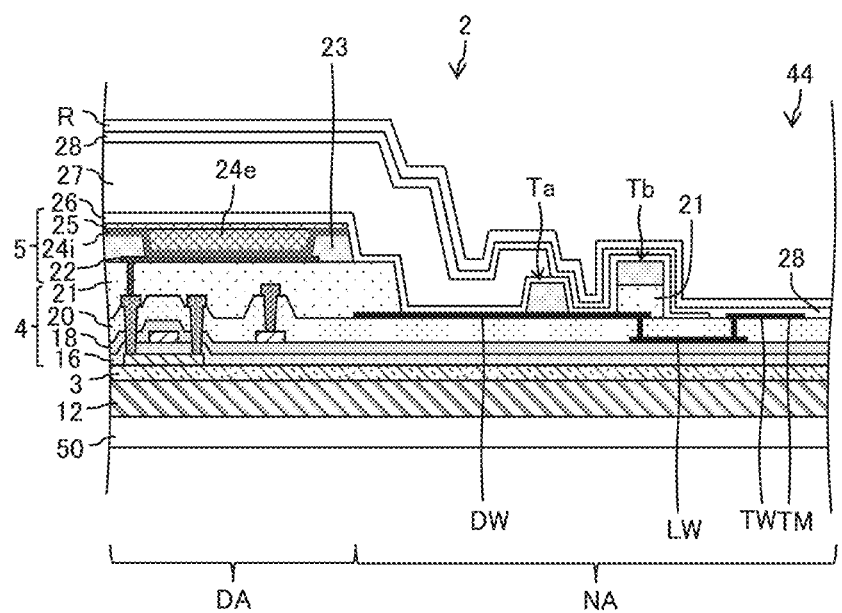
FIG. 8B is another process cross-sectional view sequentially illustrating manufacturing processes of a display device according to the first embodiment of the disclosure.

Next, as illustrated in FIG. 8B, a photoresist R is applied on the inorganic sealing film 28 (step S5-4). In this embodiment, the photoresist R is a positive-working photoresist the solubility against developing solution of which is increased by exposure. However, the photoresist R may be a negative-working photoresist the solubility against the developing solution of which is reduced by exposure.

Figure 9A:
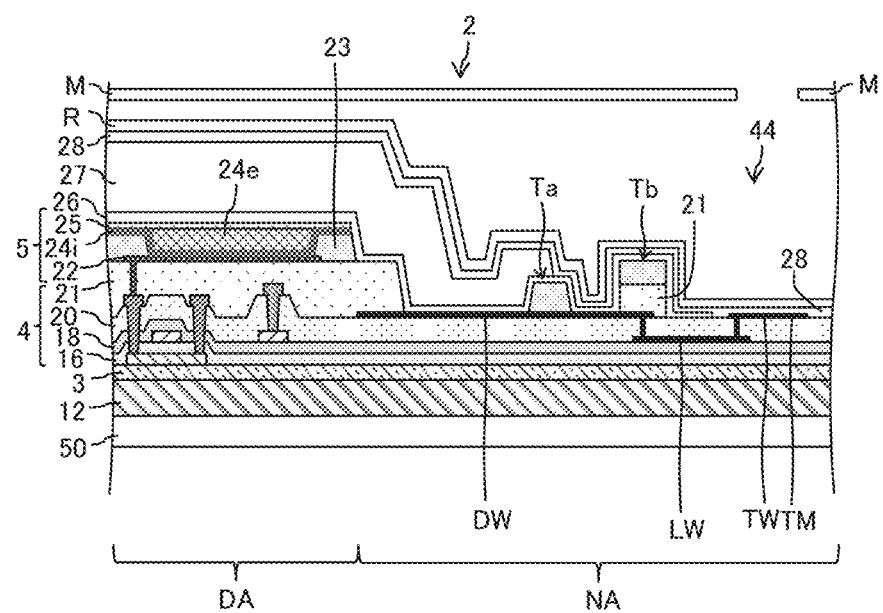
FIG. 9A is another process cross-sectional view sequentially illustrating manufacturing processes of a display device according to the first embodiment of the disclosure.

Next, as illustrated in FIG. 9A, a photomask M is placed above the photoresist R (step 5-5). The photomask M has a shape according to a position where the inorganic sealing film 28 is caused to remain. In a case that the photoresist R is negative-working, the photomask M having a shape according to a position where the inorganic sealing film 28 is caused to be removed may be disposed. In the present embodiment, a mask including a blank area at a position of the terminal TM and the terminal wiring line TW and excluding the edges thereof is disposed.

Figure 9B:
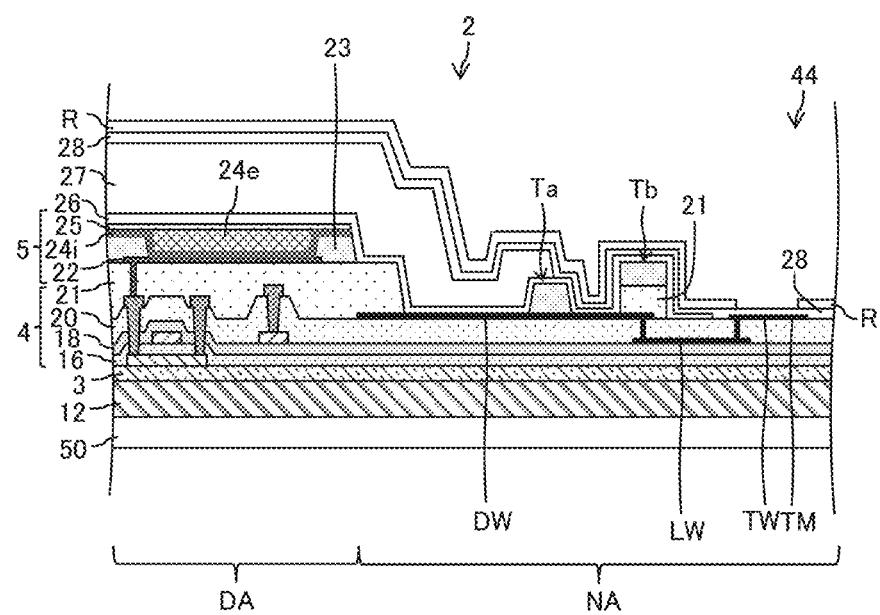
FIG. 9B is another process cross-sectional view sequentially illustrating manufacturing processes of a display device according to the first embodiment of the disclosure.

In the state illustrated in FIG. 9A, the photoresist R is irradiated with light from above the photomask M to expose the photoresist R (step S5-6). This provides the photoresist R irradiated with light not blocked by the photomask M with increased solubility against developing solution. Next, the photoresist R is washed with developing solution to develop the photoresist R (step S5-7). As a result, as illustrated in FIG. 9B, the photoresist R is patterned such that only the photoresist R above the terminal TM and the terminal wiring line TW and at a position excluding the edges of the terminal TM and the terminal wiring line TW is removed.

Figure 10A:
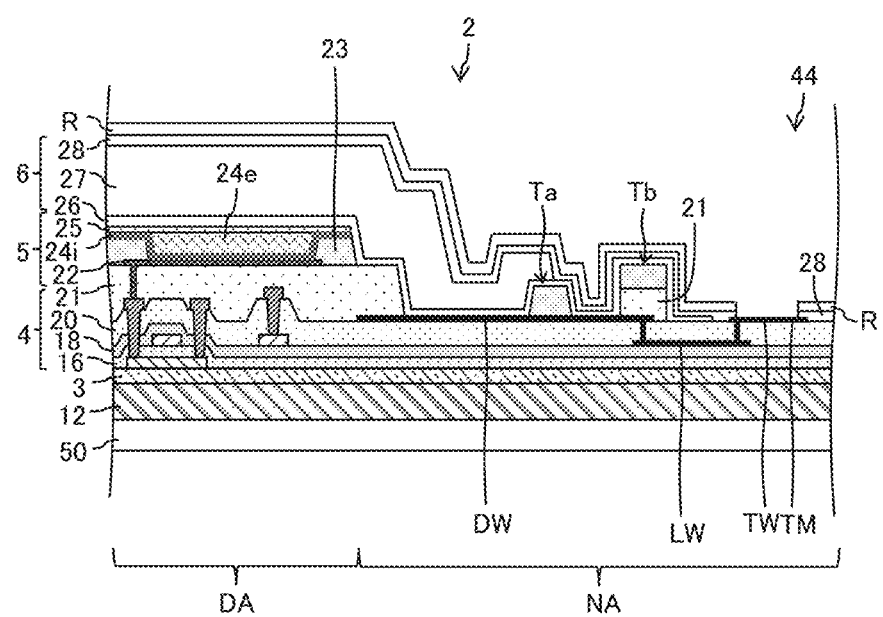
FIG. 10A is another process cross-sectional view sequentially illustrating manufacturing processes of a display device according to the first embodiment of the disclosure.

Next, the inorganic sealing film 28 is dry etched (step S5-8). At this time, the inorganic sealing film 28 is etched only at a position where the photoresist R is not disposed. As a result, as illustrated in FIG. 10A, only the inorganic sealing film 28 on the terminal TM and the terminal wiring line TW and at a position excluding the edges of the terminal TM and the terminal wiring line TW is removed. As a result, the opening 28k is formed in the inorganic sealing film 28, and the upper face of the terminal TM is exposed. Note that since the light-emitting element layer 5 is already covered with the inorganic sealing film 26 and the organic sealing film 27, damage to the light-emitting element layer 5 in a case that the inorganic sealing film 28 is dry etched can be reduced.

Figure 10B:
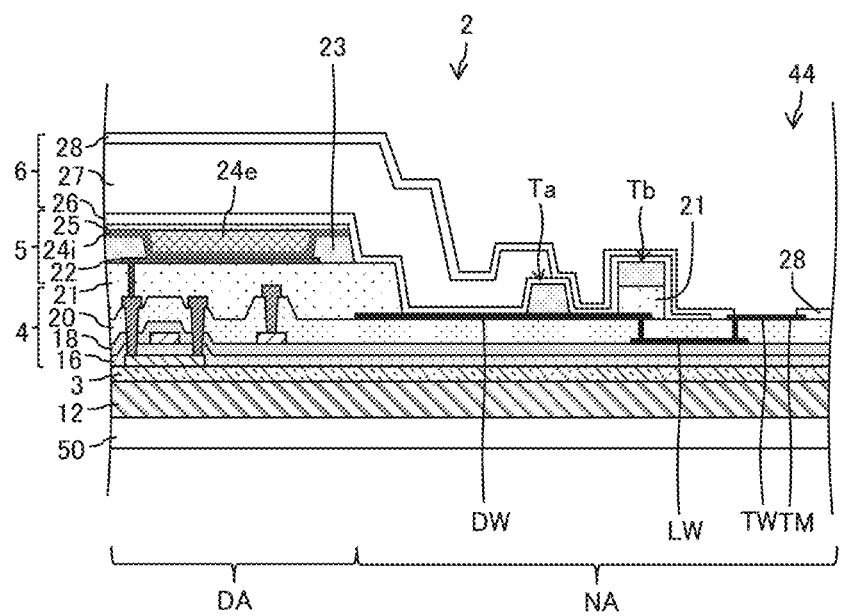
FIG. 10B is another process cross-sectional view sequentially illustrating manufacturing processes of a display device according to the first embodiment of the disclosure.

Next, the photoresist R on the inorganic sealing film 28 is peeled off and removed (step S5-9). As a result, the sealing layer 6 illustrated in FIG. 10B is obtained. Subsequently, the display device 2 illustrated in FIG. 1 is obtained by performing step S6 to step S11.

In the display device 2 illustrated in FIG. 1, the organic interlayer film 21 is not present on the edge of the terminal TM, and only the inorganic sealing film 28 is formed thereon. Thus, in subsequent step S12, in a case that a mounting substrate is mounted on the terminal TM, the terminal TM and the mounting substrate can be close to each other, and thus mounting accuracy with which the mounting substrate is mounted on the terminal TM is improved. In addition, the inorganic sealing film 28 is provided on the edges of the terminal TM and the terminal wiring line TW, and this can reduce the possibility that foreign matter enters the light-emitting element layer 5 from between the terminal TM and another layer.

Figure 11:
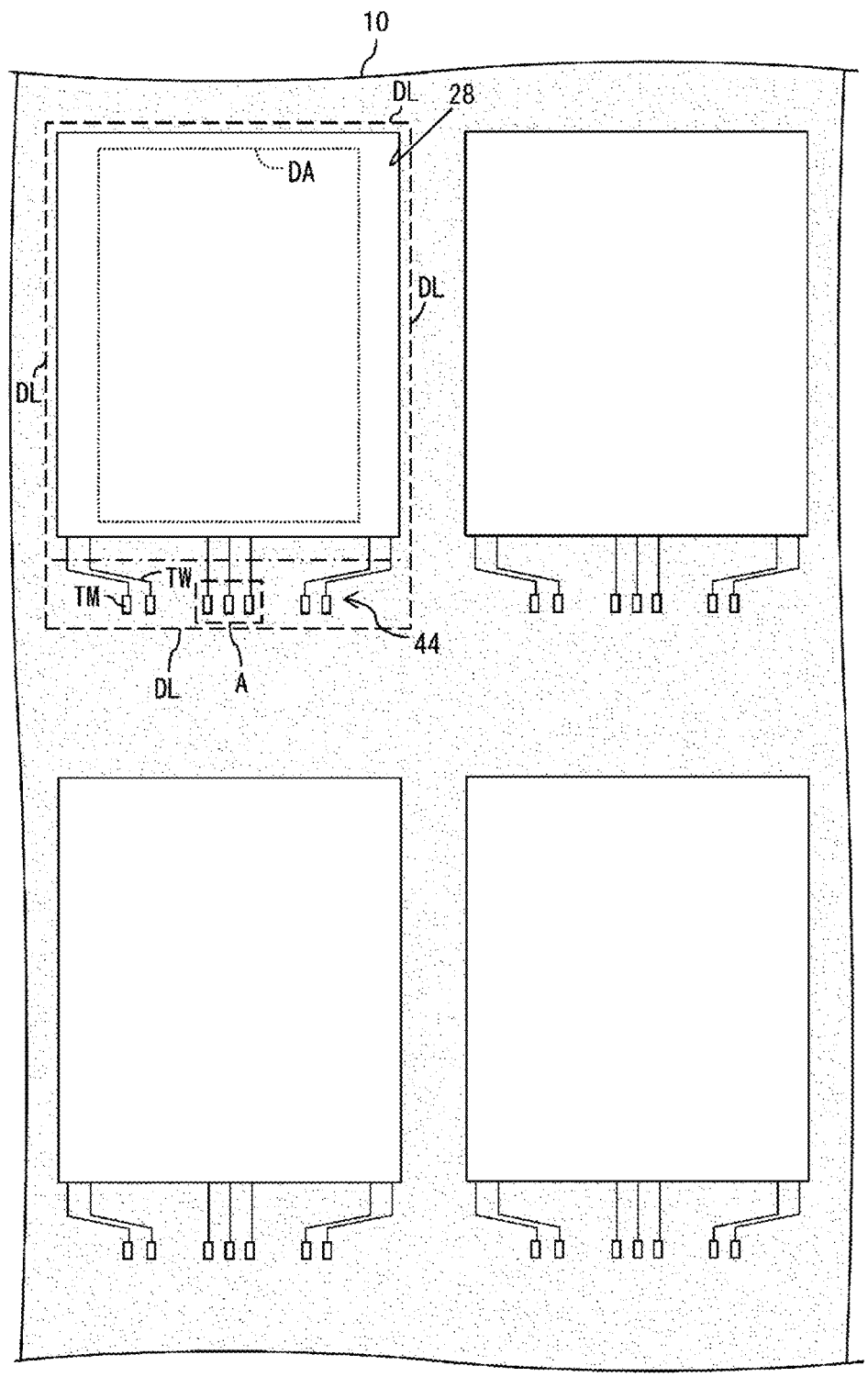
FIG. 11 is a top view of a display device before singulation according to the first embodiment of the disclosure.

FIG. 11 is a top view illustrating the display device 2 immediately before the display device is singulated in step S10.

In the display device 2 according to the present embodiment, end faces of the layers above the barrier layer 3 are covered with the inorganic sealing film 28. This can reduce the possibility that foreign matter enters the light-emitting element layer 5 through the interfaces between the layers above the barrier layer 3. In particular, the upper face of the end portion of the barrier layer 3 is in contact with the inorganic sealing film 28, and this can prevent foreign matter from entering the light-emitting element layer 5 and provide the light-emitting element layer 5 with improved reliability.

In the display device 2 according to the present embodiment, the inorganic sealing film 28, which is the uppermost layer of the sealing layer 6, is formed by photolithography using a mask. This allows the inorganic sealing film 28 to be formed with great accuracy in term of the forming position compared to a case that the inorganic sealing film 28 is formed by CVD using a mask.

As a result, the required formation margin can be reduced at the end portion where the inorganic sealing film 28 is formed. Accordingly, the frame region illustrated in FIG. 11 can be reduced that is a region of a forming region DL of the display device 2 excluding the active area DA in which the pixels and TFTs are formed. In addition, in the display device 2 according to the present embodiment, the inorganic sealing film 28 having a complex structure can be formed in a limited area such that the inorganic sealing film 28 is provided on only the edges of the terminal TM and the terminal wiring line TW.

Figure 12:
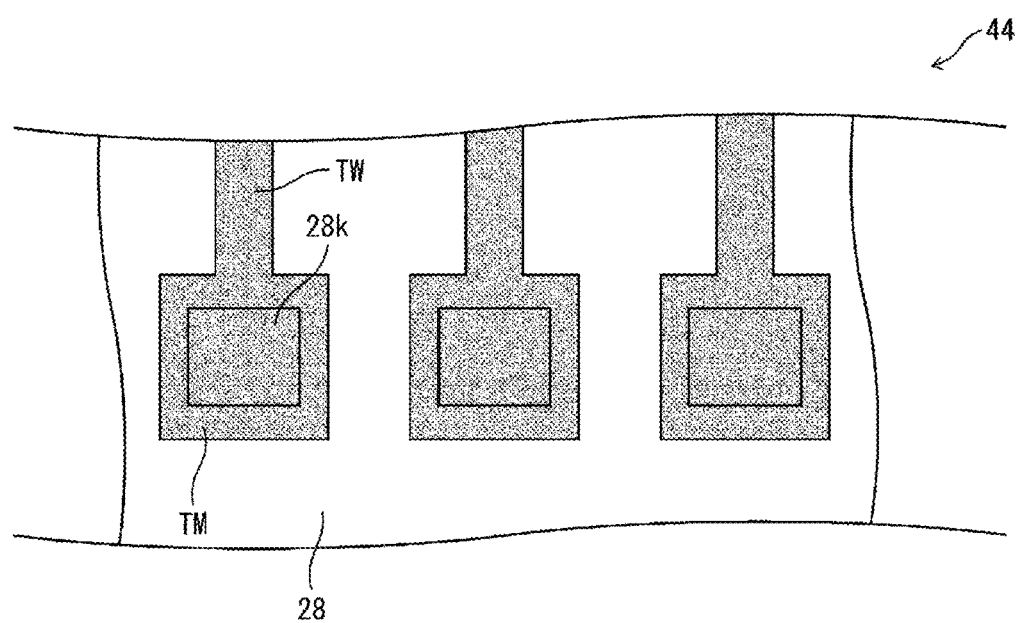
FIG. 12 is an enlarged top view of a region A in FIG. 11.

FIG. 12 is an enlarged top view of a region A in FIG. 11, that is, illustrates the upper face of the terminal TM. The terminal TM is configured by a metal layer of the TFT layer 4, and a plurality of terminals TM are provided in the non-active area NA. Each of the end face of the terminal TM is covered with the inorganic sealing film 28, and the inorganic sealing film 28 includes the opening 28k at a position overlapping the upper face of the terminal TM. The terminal TM can be connected to the outside in the opening 28k.

Figure 13:
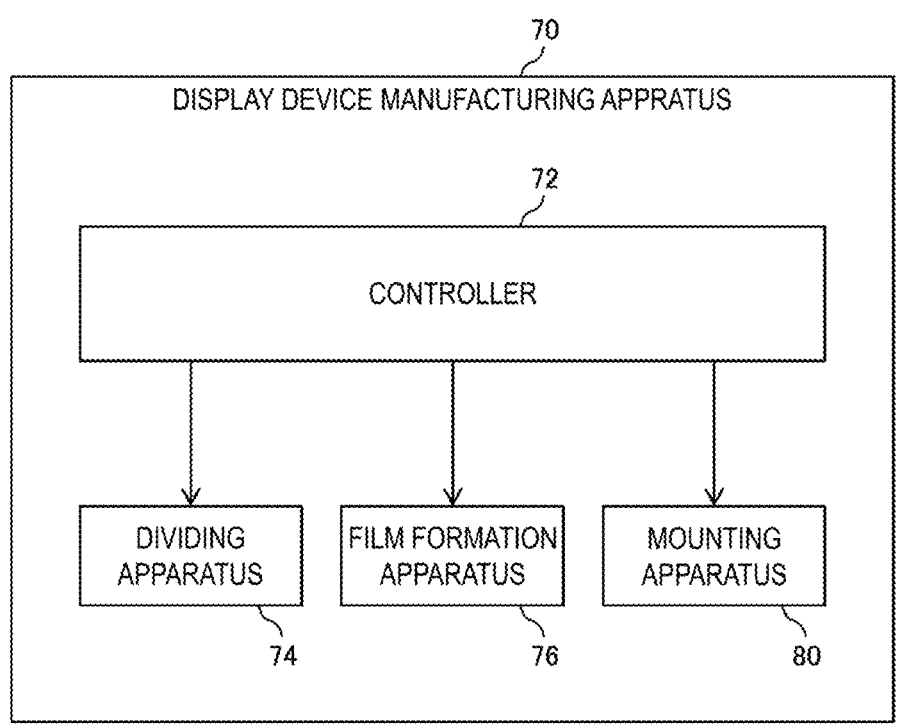
FIG. 13 is a block diagram illustrating a manufacturing apparatus of a display device according to the first embodiment of the disclosure.

FIG. 13 is a block diagram illustrating a display device manufacturing apparatus 70 according to the present embodiment. The display device manufacturing apparatus 70 includes a controller 72, a dividing apparatus 74, a film formation apparatus 76, and a mounting apparatus 80. The dividing apparatus 74 divides the mother substrate into the display devices 2. The film formation apparatus 76 forms each layer of the display device 2. The mounting apparatus 80 mounts the mounting substrate on the terminal TM of the display device 2. The controller 72 controls the dividing apparatus 74, the film formation apparatus 76, and the mounting apparatus 80.

Figure 14:
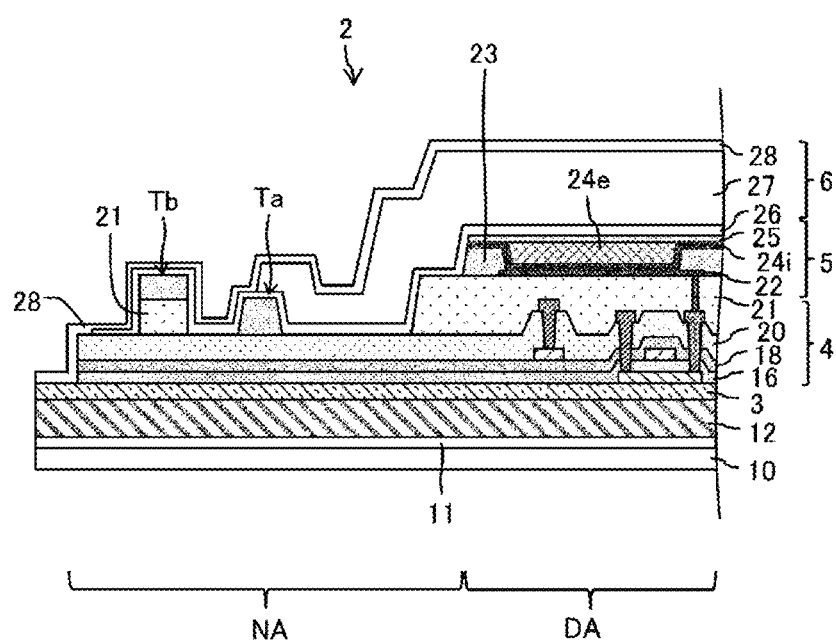
FIG. 14 is a cross-sectional view illustrating a periphery of a frame region of a display device in which a terminal portion is not present according to the first embodiment of the disclosure.

FIG. 14 is a cross-sectional view of a periphery of the frame region where the terminal portion 44 of the display device 2 according to the present embodiment is not present. In the frame region in which the terminal portion 44 of the display device 2 is not present, at least a part of the end face 4t of the plurality of inorganic insulating films of the TFT layer 4 is also covered with the inorganic sealing film 28, and the inorganic sealing film 28 is in contact with the upper face of the end portion of the barrier layer 3.

Second Embodiment

A method for manufacturing a display device 2 according to the second embodiment will now be described with reference to FIG. 15A to FIG. 17B. Note that FIG. 15A to FIG. 17B are cross-sectional views of a periphery of the terminal portion 44 of one of the two adjacent display devices 2 on the mother substrate, and a periphery of the frame region, in which the terminal portion is not present, of the other display device 2.

Figure 15A:
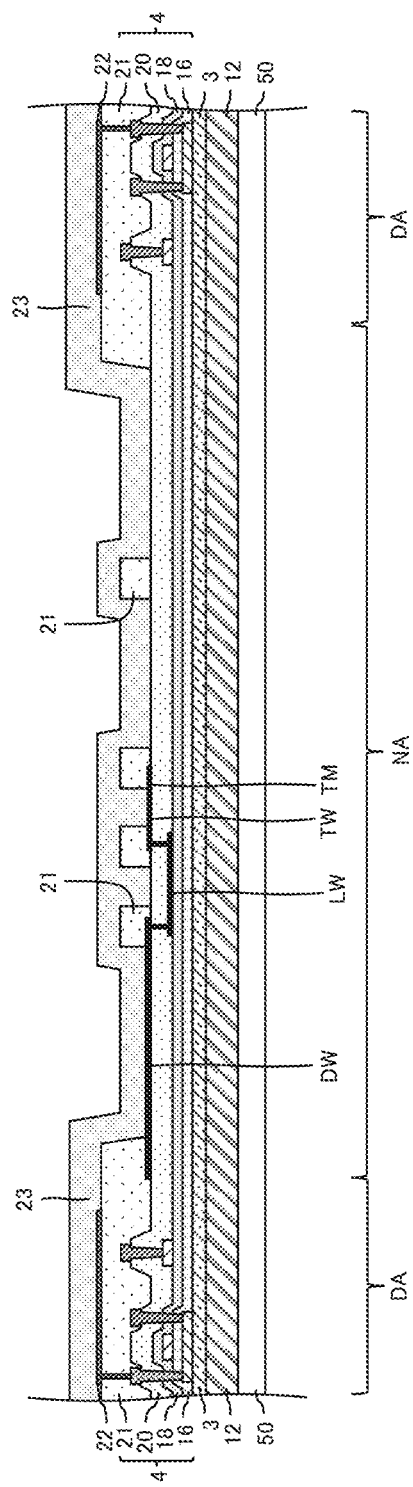
FIG. 15A is a process cross-sectional view sequentially illustrating manufacturing processes of a display device according to a second embodiment of the disclosure.

First, as illustrated in FIG. 15A, steps to the application of the organic insulating film 23 are performed in the same way as in the method for manufacturing a display device 2 of the previous embodiment. Next, the organic insulating film 23 is patterned. In the present embodiment, the organic interlayer film 21 with which the edge of the terminal TM is covered is also removed by patterning the organic insulating film 23.

Figure 15B:
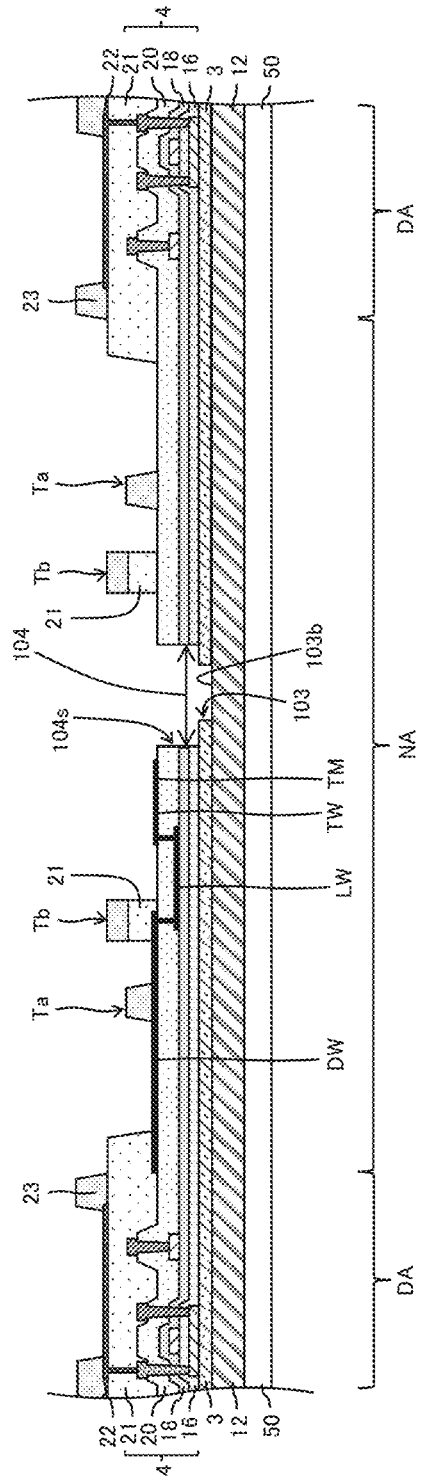
FIG. 15B is a process cross-sectional view sequentially illustrating manufacturing processes of a display device according to a second embodiment of the disclosure.

Next, in a portion of the layered body 7, a mother barrier layer 3 and a mother TFT layer 4 formed above the mother glass substrate 50 are removed to provide a first through-hole 103. Next, in a portion of the layered body 7, the mother TFT layer 4 is removed to provide a second through-hole 104. As a result, a structure illustrated in FIG. 15B is obtained. The second through-hole 104 is formed such that an opening of the first through-hole 103 is located inside an opening of the second through-hole 104.

Figure 16A:
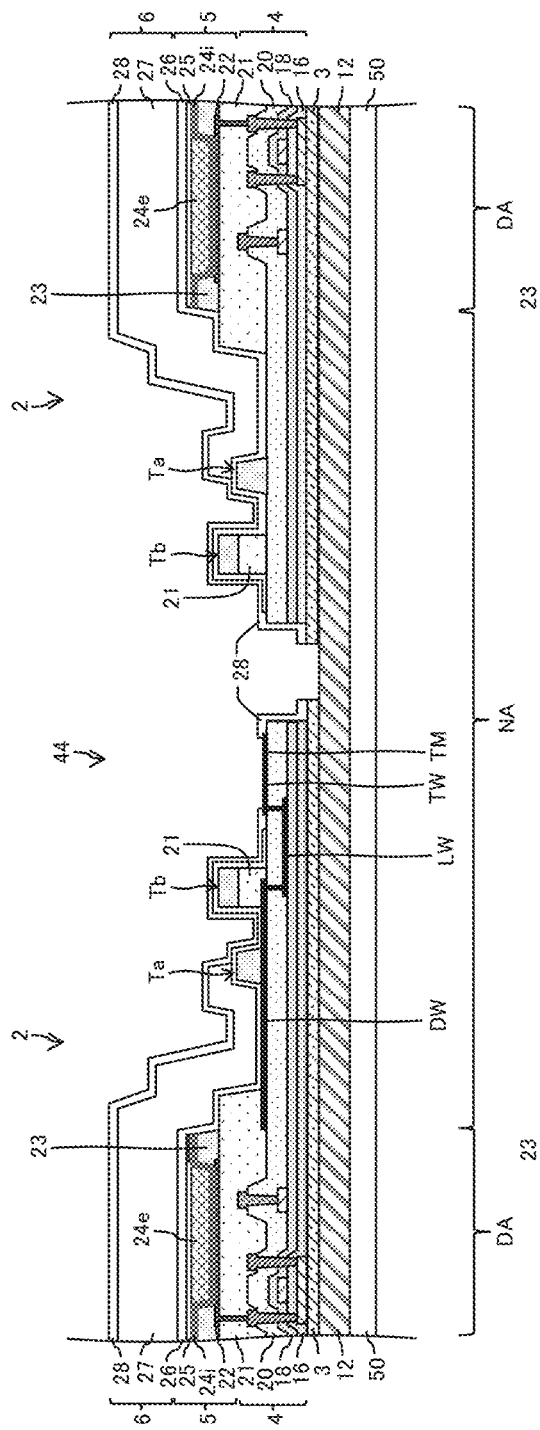
FIG. 16A is another process cross-sectional view sequentially illustrating manufacturing processes of a display device according to the second embodiment of the disclosure.
Figure 16B:
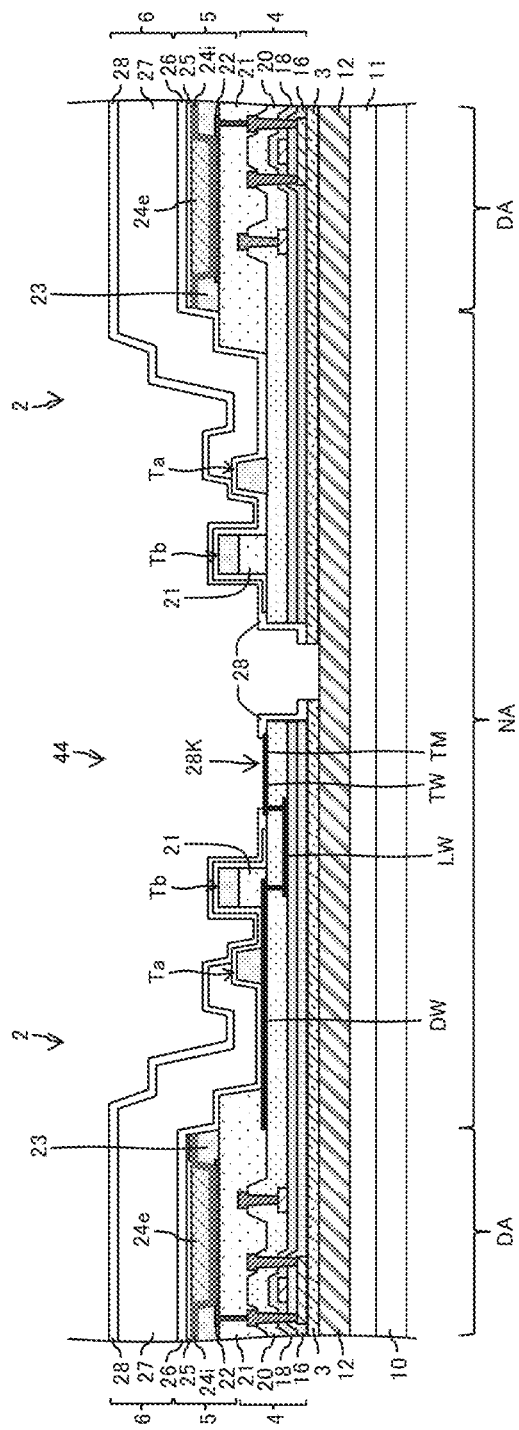
FIG. 16B is another process cross-sectional view sequentially illustrating manufacturing processes of a display device according to the second embodiment of the disclosure.

Next, as illustrated in FIG. 16A, the sealing layer 6 is formed. The sealing layer 6 may be formed by the same method as that of the previous embodiment. At this time, the inorganic sealing film 28 is also formed on an inner wall 104s of the second through-hole 104. Furthermore, the inorganic sealing film 28 is not formed on at least a part of a bottom face 103b of the first through-hole 103 by patterning using photolithography. From this state, the glass substrate 50 is peeled off, and the lower face film 10 is bonded to the display device 2 from below with the adhesive layer 11 therebetween. As a result, the structure illustrated in FIG. 16B is obtained.

Figure 17A:
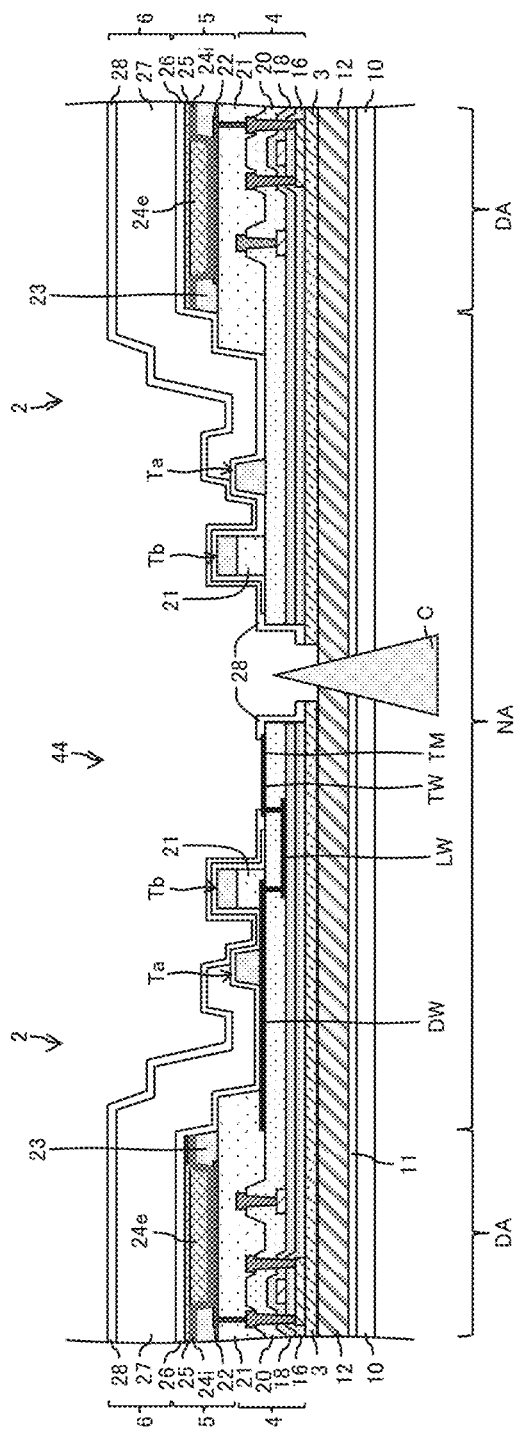
FIG. 17A is another process cross-sectional view sequentially illustrating manufacturing processes of a display device according to the second embodiment of the disclosure.
Figure 17B:
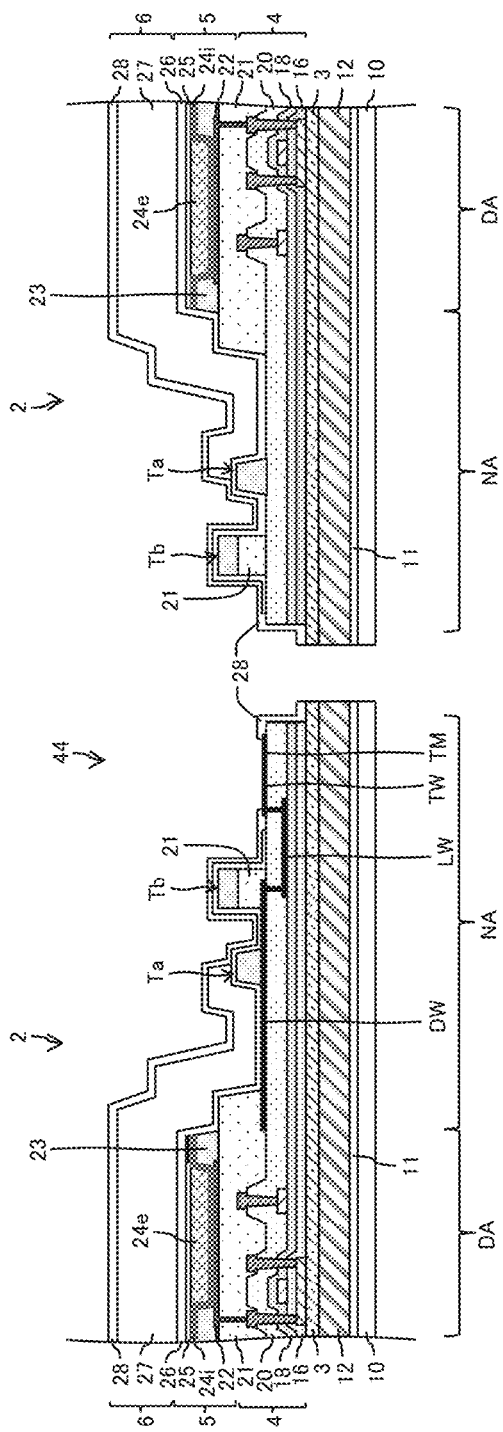
FIG. 17B is another process cross-sectional view sequentially illustrating manufacturing processes of a display device according to the second embodiment of the disclosure.

Next, as illustrated in FIG. 17A, the two display devices 2 are separated from each other with a cutter C. The cutter C may be, for example, a laser cutter. At this time, the mother glass substrate 50, the mother barrier layer 3, and the mother TFT layer 4 are divided such that the cutter C passes along the bottom face 103b in the first through-hole 103. Thus, layered objects to be divided with the cutter C can be reduced to only the lower face film 10, the adhesive layer 11, and the resin layer 12. As a result, the ease of separating the display devices 2 from each other is improved. A plurality of display devices 2 illustrated in FIG. 17B are obtained by the division.

Figure 18:
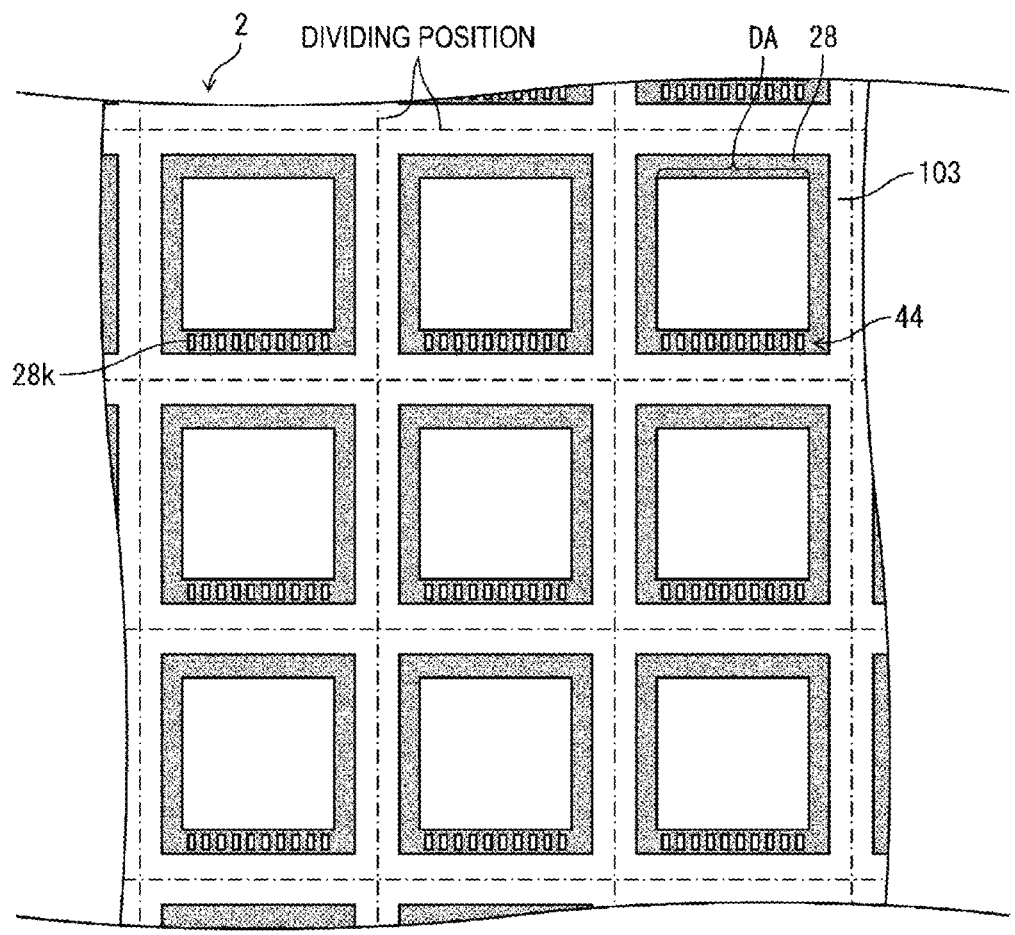
FIG. 18 is a top view illustrating a dividing position of a mother substrate and a position of an inorganic sealing film when manufacturing a display device according to the second embodiment of the disclosure.

FIG. 18 is a top view illustrating a dividing position of the mother substrate and a position of the inorganic sealing film 28 when manufacturing the display device 2 described above. The inorganic sealing film 28 is patterned along the dividing position of the mother substrate, and the first through-hole 103 is formed. In addition, the inorganic sealing film 28 also includes the opening 28k at a position overlapping the upper face of the terminal TM in the terminal portion 44.

The display device 2 obtained according to the present embodiment also has the same effects as that of the display device 2 according to the previous embodiment. In the present embodiment, the display device manufacturing apparatus 70 may also manufacture the display device 2.

Third Embodiment

Figure 19:
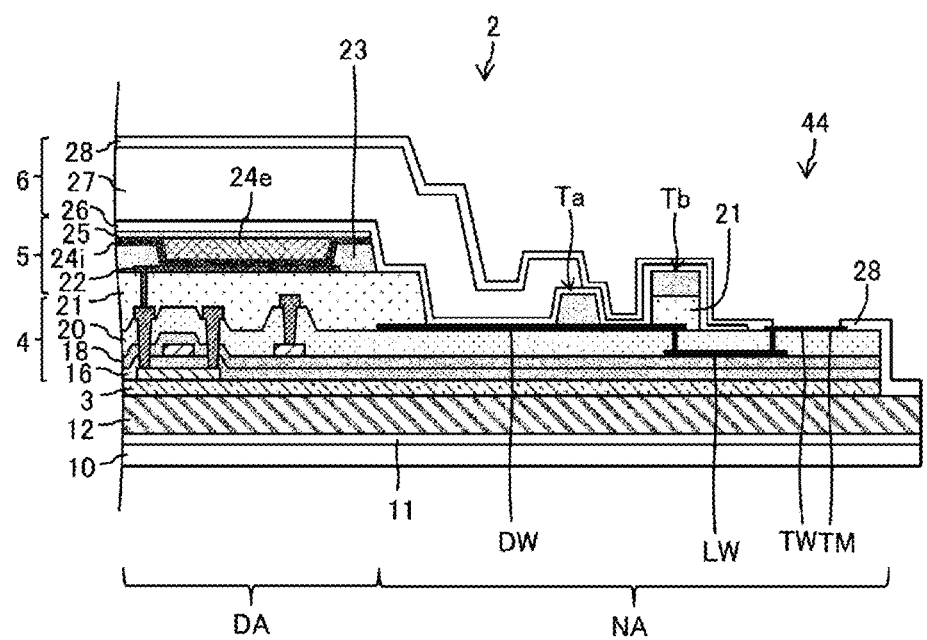
FIG. 19 is a cross-sectional view illustrating a periphery of a terminal portion of a display device according to a third embodiment of the disclosure.

FIG. 19 is a view illustrating the display device 2 according to the third embodiment. The display device 2 according the present embodiment differs from the display device 2 according to the previous embodiment in that the inorganic sealing film 28 is in contact with the side face of the barrier layer 3 at the end portion of the barrier layer 3.

The display device 2 according to the present embodiment can be manufactured in the same manner as the manufacturing method described in the second embodiment. However, in the present embodiment, of the first through-hole 103 and the second through-hole 104 illustrated in FIG. 15B, only the first through-hole 103 may be formed, and then, the inorganic sealing film 28 may be formed. Therefore, a plurality of masks for providing a plurality of through-holes are not required, and additional steps need not be performed. Therefore, the display device 2 according to the present embodiment can be manufactured by a simple manufacturing method with reduced manufacturing costs.

Supplement

A display device according to aspect 1 includes a light-emitting element layer including a light-emitting element, a TFT layer formed in a lower layer than the light-emitting element layer and including a transistor configured to be used to drive the light-emitting element, and a sealing layer with which the light-emitting element layer is covered, wherein the sealing layer includes a first inorganic sealing film and a second inorganic sealing film in an upper layer than the first inorganic sealing film, and at least a part of an end face of the TFT layer is covered with the second inorganic sealing film.

In aspect 2, the TFT layer includes a metal layer including a terminal configured for external connection, an end face of the terminal is covered with the second inorganic sealing film, and the second inorganic sealing film includes an opening at a position overlapping an upper face of the terminal.

In aspect 3, the display device further includes a resin layer in a lower layer than the TFT layer and a barrier layer between the TFT layer and the resin layer. The second inorganic sealing film is in contact with an end portion of the barrier layer.

In aspect 4, the second inorganic sealing film is in contact with an upper face of an end portion of the barrier layer.

In aspect 5, the second inorganic sealing film is in contact with a side face of an end portion of the barrier layer.

In aspect 6, an entire surface of an active area is covered with the first inorganic sealing film, and an end face of the first inorganic sealing film is covered with the second inorganic sealing film.

In aspect 7, the sealing layer includes an organic sealing film disposed between the first inorganic sealing film and the second inorganic sealing film, the entire surface of the active area is covered with the organic sealing film, and an end face of the organic sealing film is covered with the second inorganic sealing film.

In aspect 8, the TFT layer includes a plurality of inorganic insulating films, and an end face of each of the plurality of inorganic insulating films is covered with the second inorganic sealing film.

A method for manufacturing a display device according to aspect 9 is a method for manufacturing a display device including a light-emitting element layer including a light-emitting element, a TFT layer formed in a lower layer than the light-emitting element layer and including a transistor configured to be used to drive the light-emitting element, and a sealing layer with which the light-emitting element layer is covered. The method includes forming the first inorganic sealing film and forming the second inorganic sealing film using a photolithographic method after forming the first inorganic sealing film.

In aspect 10, a photolithographic method is not used to form the first inorganic sealing film, and the first inorganic sealing film is patterned and formed by film forming using a mask.

In aspect 11, the second inorganic sealing film is formed such that at least a part of an end face of the TFT layer is covered with the second inorganic sealing film.

In aspect 12, in a case that a bank of the light-emitting element layer is formed, an organic interlayer film with which a terminal of the TFT layer is covered is removed.

In aspect 13, after the second inorganic sealing film is formed such that the terminal is covered with the second inorganic sealing film, an opening is formed in the second inorganic sealing film using a photolithographic method to expose an upper face of the terminal.

In aspect 14, in a mother barrier layer and a mother TFT layer formed above a mother glass substrate, a first through-hole is provided in the mother barrier layer, a second through-hole communicating with the first through-hole is provided in the mother TFT layer, and the second inorganic sealing film is formed on an inner wall of the second through-hole.

In aspect 15, in a plan view, an opening of the first through-hole is located inside an opening of the second through-hole.

In aspect 16, in patterning using a photolithographic method, the second inorganic sealing film is not formed on at least a part of a bottom face of the first through-hole.

In aspect 17, the method further includes dividing the mother glass substrate, the mother barrier layer, and the mother TFT layer with a dividing face extending along at least a part of a bottom face of the first through-hole.

In aspect 18, the second inorganic sealing film is patterned along a dividing position in the dividing the mother glass substrate, the mother barrier layer, and the mother TFT layer.

A manufacturing apparatus of a display device according to aspect 19 is a manufacturing apparatus of a display device including a light-emitting element layer including a light-emitting element, a TFT layer formed in a lower layer than the light-emitting element layer and including a transistor configured to be used to drive the light-emitting element, and a sealing layer with which the light-emitting element layer is covered, wherein after the first inorganic sealing film is formed, the second inorganic sealing film is formed using a photolithographic method.

The disclosure is not limited to each of the embodiments described above, and various modifications may be made within the scope of the claims. Embodiments obtained by appropriately combining technical approaches disclosed in each of the different embodiments also fall within the technical scope of the disclosure. Moreover, novel technical features can be formed by combining the technical approaches disclosed in the embodiments.

REFERENCE SIGNS LIST

2 Display device
3 Barrier layer
4 TFT layer
5 Light-emitting element layer
6 Sealing layer
7 Layered body
21 Organic interlayer film
24e EL layer
26 Inorganic sealing film (First inorganic sealing film)
27 Organic sealing film
28 Inorganic sealing film (Second inorganic sealing film)
44 Terminal portion
70 Display device manufacturing apparatus
TM Terminal
TW Terminal wiring line

The invention claimed is:

1. A display device comprising:
a light-emitting element layer including a light-emitting element;
a TFT layer formed in a lower layer than the light-emitting element layer and including a transistor configured to be used to drive the light-emitting element; and
a sealing layer with which the light-emitting element layer is covered, wherein
the sealing layer includes a first inorganic sealing film and a second inorganic sealing film in an upper layer than the first inorganic sealing film,
at least a part of an end face of the TFT layer is covered with the second inorganic sealing film,
the TFT layer includes a metal layer including a terminal configured for external connection, and
an end face of the terminal is covered with the second inorganic sealing film, and
the second inorganic sealing film includes an opening at a position overlapping an upper face of the terminal.

2. The display device according to claim 1 further comprising:
a resin layer in a lower layer than the TFT layer; and
a barrier layer between the TFT layer and the resin layer, wherein the second inorganic sealing film is in contact with an end portion of the barrier layer.

3. The display device according to claim 2,
wherein the second inorganic sealing film is in contact with an upper face of an end portion of the barrier layer.

4. The display device according to claim 2,
wherein the second inorganic sealing film is in contact with a side face of an end portion of the barrier layer.

5. The display device according to claim 1,
wherein an entire surface of an active area is covered with the first inorganic sealing film, and
an end face of the first inorganic sealing film is covered with the second inorganic sealing film.

6. The display device according to claim 5,
wherein the sealing layer includes an organic sealing film disposed between the first inorganic sealing film and the second inorganic sealing film,
the entire surface of the active area is covered with the organic sealing film, and
an end face of the organic sealing film is covered with the second inorganic sealing film.

7. The display device according to claim 1,
wherein the TFT layer includes a plurality of inorganic insulating films, and
an end face of each of the plurality of inorganic insulating films is covered with the second inorganic sealing film.

8. A method for manufacturing a display device including a light-emitting element layer including a light-emitting element, a TFT layer formed in a lower layer than the light-emitting element layer and including a transistor configured to be used to drive the light-emitting element, and a sealing layer with which the light-emitting element layer is covered, the sealing layer including a first inorganic sealing film and a second inorganic sealing film in an upper layer than the first inorganic sealing film, the method comprising:
forming the first inorganic sealing film; and
forming the second inorganic sealing film using a photolithographic method after forming the first inorganic sealing film.

9. The method for manufacturing a display device according to claim 8,
wherein a photolithographic method is not used to form the first inorganic sealing film, and the first inorganic sealing film is patterned and formed by film forming using a mask.

10. The method for manufacturing a display device according to claim 8,
wherein the second inorganic sealing film is formed such that at least a part of an end face of the TFT layer is covered with the second inorganic sealing film.

11. The method for manufacturing a display device according to claim 8,
wherein in a case that a bank of the light-emitting element layer is formed, an organic interlayer film with which a terminal of the TFT layer is covered is removed.

12. The method for manufacturing a display device according to claim 11,
wherein, after the second inorganic sealing film is formed such that the terminal is covered with the second inorganic sealing film, an opening is formed in the second inorganic sealing film using a photolithographic method to expose an upper face of the terminal.

13. The method for manufacturing a display device according to claim 10,
wherein, in a mother barrier layer and a mother TFT layer formed above a mother glass substrate, a first through-hole is provided in the mother barrier layer and a second through-hole communicating with the first through-hole is provided in the mother TFT layer, and
the second inorganic sealing film is formed on an inner wall of the second through-hole.

14. The method for manufacturing a display device according to claim 13,
wherein, in a plan view, an opening of the first through-hole is located inside an opening of the second through-hole.

15. The method for manufacturing a display device according to claim 13,
wherein in patterning using a photolithographic method, the second inorganic sealing film is not formed on at least a part of a bottom face of the first through-hole.

16. The method for manufacturing a display device according to claim 15 further comprising:
dividing the mother glass substrate, the mother barrier layer, and the mother TFT layer with a dividing face extending along at least a part of a bottom face of the first through-hole.

17. The method for manufacturing a display device according to claim 16,
wherein the second inorganic sealing film is patterned along a dividing position in the dividing the mother glass substrate, the mother barrier layer, and the mother TFT layer.

18. A manufacturing apparatus of a display device including a light-emitting element layer including a light-emitting element, a TFT layer formed in a lower layer than the light-emitting element layer and including a transistor configured to be used to drive the light-emitting element, and a sealing layer with which the light-emitting element layer is covered, the sealing layer including a first inorganic sealing film and a second inorganic sealing film in an upper layer than the first inorganic sealing film,
wherein after the first inorganic sealing film is formed, the second inorganic sealing film is formed using a photolithographic method.

* * * * *